United States Patent
Stott et al.

(10) Patent No.: US 9,882,463 B2
(45) Date of Patent: Jan. 30, 2018

(54) IN OR RELATING TO CHAIN-LINK CONVERTERS

(71) Applicant: General Electric Technology GmbH, Baden (CH)

(72) Inventors: Timothy James Stott, Staffordshire (GB); Francisco Jose Moreno Muñoz, Stafford (GB); Philip Robin Couch, Devon (GB)

(73) Assignee: GENERAL ELECTRIC TECHNOLOGY GMBH (CH)

( * ) Notice: Subject to any disclaimer, the term of this patent is extended or adjusted under 35 U.S.C. 154(b) by 0 days.

(21) Appl. No.: 15/309,398

(22) PCT Filed: May 12, 2015

(86) PCT No.: PCT/EP2015/060451
§ 371 (c)(1),
(2) Date: Nov. 7, 2016

(87) PCT Pub. No.: WO2015/173228
PCT Pub. Date: Nov. 19, 2015

(65) Prior Publication Data
US 2017/0077797 A1    Mar. 16, 2017

(30) Foreign Application Priority Data

May 12, 2014    (EP) .................................... 14275116

(51) Int. Cl.
*H02M 1/32*    (2007.01)
*H02M 7/483*    (2007.01)
(Continued)

(52) U.S. Cl.
CPC ............ *H02M 1/088* (2013.01); *G01R 31/02* (2013.01); *H02M 1/32* (2013.01); *H02M 7/483* (2013.01);
(Continued)

(58) Field of Classification Search
CPC ............. H02M 1/32; H02M 2001/325; H02M 2007/4835; H02M 7/483
See application file for complete search history.

(56) References Cited

U.S. PATENT DOCUMENTS

2008/0200748 A1    8/2008    Testani et al.
2010/0321038 A1    12/2010    Dommaschk et al.
(Continued)

FOREIGN PATENT DOCUMENTS

CN    103199719 A    7/2013
WO    2009092848 A2    7/2009
(Continued)

OTHER PUBLICATIONS

Driel et al., "Solid State Lighting Reliability: Components to Systems", Electronics & Electrical Engineering, pp. 258-261, Jan. 31, 2013.
(Continued)

*Primary Examiner* — Timothy J Dole
*Assistant Examiner* — Ishrat Jamali
(74) *Attorney, Agent, or Firm* — GE Global Patent Operation; Scott R. Stanley

(57) ABSTRACT

A method of identifying a faulty sub-module of a chain-link converter is provided, wherein the chain-link converter includes a plurality of sub-modules with each sub-module including at least one switching element and an energy storage device which together are selectively operable to provide a voltage source. The method comprises the steps of: measuring a switching characteristic of each sub-module of the chain-link converter; establishing a switching characteristic signature of the chain-link converter; and identifying the or each sub-module with a switching characteristic that deviates from the switching characteristic signature as being a faulty sub-module.

17 Claims, 3 Drawing Sheets

(51) Int. Cl.
    *H02M 1/088*    (2006.01)
    *G01R 31/02*    (2006.01)
    *H02M 1/00*     (2006.01)

(52) U.S. Cl.
    CPC ............... *H02M 2001/0003* (2013.01); *H02M 2001/325* (2013.01); *H02M 2007/4835* (2013.01)

(56) References Cited

U.S. PATENT DOCUMENTS

| | | | |
|---|---|---|---|
| 2011/0163702 A1* | 7/2011 | Dommaschk | H02P 3/22 318/376 |
| 2012/0049837 A1 | 3/2012 | Chimento et al. | |
| 2014/0321019 A1 | 10/2014 | Volke | |
| 2016/0233762 A1* | 8/2016 | Mathew | H02M 7/483 |

FOREIGN PATENT DOCUMENTS

| | | | |
|---|---|---|---|
| WO | 2013092045 A1 | 6/2013 | |
| WO | 2015096907 A1 | 7/2015 | |

OTHER PUBLICATIONS

A PCT Search Report and Written Opinion issued in connection with corresponding PCT Application No. PCT/EP2015/060451 dated Jul. 27, 2015.

Hans et a; "A Novel Method for On-Line Monitoring and Managing of Electrolytic Capacitors of DC Voltage Link PWM Converters" May 24, 2006 XP55146649 retrieved from: https://www.pes.ee.ethz.ch/uploads/tx_ethpublications/ertl_PCIM06.pdf.

* cited by examiner

IN OR RELATING TO CHAIN-LINK CONVERTERS

FIELD OF THE INVENTION

Embodiments of the invention relate to a method of identifying a faulty sub-module of a chain-link converter.

BACKGROUND

In power transmission networks alternating current (AC) power is typically converted to direct current (DC) power for transmission via overhead lines and/or under-sea cables. This conversion removes the need to compensate for the AC capacitive load effects imposed by the transmission line or cable, and thereby reduces the cost per kilometer of the lines and/or cables. Conversion from AC to DC thus becomes cost-effective when power needs to be transmitted over a long distance.

The conversion between AC power and DC power is also utilized in power transmission networks where it is necessary to interconnect AC electrical networks operating at different frequencies. In any such power transmission network, converters are required at each interface between AC and DC power to effect the required conversion, and one such form of converter is a voltage source converter.

A typical voltage source converter is shown schematically in FIG. 1. The voltage source converter 10 includes first and second DC terminals 12, 14 between which extends a converter limb 16. Other voltage source converters may include more than one converter limb 16 and, in particular, may include three converter limbs each of which corresponds to a given phase of a three-phase electrical power system.

The converter limb 16 includes first and second limb portions 18, 20 which are separated by an alternating current (AC) terminal 22.

In use the first and second DC terminals 12, 14 are respectively connected to positive and negative terminals of a DC network, and the AC terminal 22 is connected to an AC network.

Each limb portion 18, 20 includes a chain-link converter 24 which extends between the AC terminal 22 and a corresponding one of the first or the second DC terminal 12, 14. Each chain-link converter 24 includes a plurality of series connected chain-link sub-modules 26.

Each chain-link sub-module 26 includes at least one switching element (not shown) which is connected in parallel with an energy storage device in the form of, e.g. a capacitor. The or each switching element may include a semiconductor device in the form of, e.g. an Insulated Gate Bipolar Transistor (IGBT), which is connected in anti-parallel with a diode although it is possible to use other semiconductor devices.

Switching of the or each switching element selectively directs current through the capacitor or causes current to bypass the capacitor such that each sub-module 26 is selectively able to provide a voltage. In this manner it is possible to build up a combined voltage across each chain-link converter 24, via the insertion of the capacitors of multiple chain-link sub-modules 26 (with each sub-module 26 providing its own voltage), which is higher than the voltage available from each individual sub-module 26.

The chain-link sub-modules 26 work together to permit the chain-link converter 24 to provide a stepped variable voltage source. This permits the generation of a voltage waveform across each chain-link converter 24 using a step-wise approximation. Operation of each chain-link converter 24 in this manner can be used to generate an AC voltage waveform at the AC terminal 22, and thereby enable the voltage source converter 10 to provide the aforementioned power transfer functionality between the AC and DC networks.

BRIEF DESCRIPTION

According to a first aspect of the invention there is provided a method of identifying a faulty sub-module of a chain-link converter, the chain-link converter including a plurality of sub-modules, each sub-module including at least one switching element and an energy storage device which together are selectively operable to provide a voltage source, the method comprising the steps of: measuring a switching characteristic of each sub-module of the chain-link converter; establishing a switching characteristic signature of the chain-link converter; and identifying the or each sub-module with a switching characteristic that deviates from the switching characteristic signature as being a faulty sub-module.

A defective or degraded sub-module within the chain-link converter, e.g. a sub-module which includes a faulty energy storage device, will tend to release and store energy at a different rate, i.e. faster or slower, than a fully-functioning sub-module. As a result such a defective or degraded sub-module may be switched into and out of circuit at a different rate to the other fully-functioning sub-modules in the chain-link converter or may be in an ON or OFF state for a different amount of time, in order that all of the sub-modules have approximately the same voltage thereacross.

A defective or degraded sub-module will tend to exhibit a different switching characteristic to each of the other, fully-functioning sub-modules, such that a consideration of the switching characteristic of a given sub-module can be used to reliably identify a faulty sub-module which should, e.g. be more carefully monitored and/or replaced during a subsequent routine or exceptional maintenance period.

The switching characteristic may comprise a switching frequency. The switching characteristic signature may comprise a switching frequency signature. The switching characteristic may comprise a switching duration. The switching characteristic signature may comprise a switching duration signature.

The step of establishing a switching characteristic signature of the chain-link converter may comprise establishing a switching characteristic signature of the chain-link converter from the measured switching characteristics.

More particularly, establishing a switching characteristic signature for the chain-link converter from measured switching characteristics permits the identification of a faulty module, i.e. by identifying the or each sub-module with a switching characteristic that deviates from the switching characteristic signature, without, for example, having to measure directly the energy storage capability of the energy storage device, i.e., without having to utilise a capacitance diagnosis device to determine the actual capacitance of an energy storage device in the form of a capacitor, which can be relatively time-consuming and difficult to do during continued operation of the chain-link converter.

Furthermore, establishing the switching characteristic signature for the chain-link converter from measured switching characteristics means that the switching characteristic signature automatically adapts to different operating conditions of the chain-link converter.

The step of measuring a switching characteristic of each sub-module of the chain-link converter may include measuring a switching frequency of each sub-module of the chain-link converter. The step of establishing a switching characteristic signature of the chain-link converter may include establishing a switching frequency signature of the chain-link converter from the measured switching frequencies. The step of identifying the or each sub-module with a switching characteristic that deviates from the switching characteristic signature as being a faulty sub-module may include identifying the or each sub-module with a switching frequency that deviates from the switching frequency signature.

The step of measuring a switching characteristic of each sub-module of the chain-link converter may include measuring for each sub-module of the chain-link converter a switching duration between the sub-module providing a voltage source and not providing a voltage source. The step of establishing a switching characteristic signature of the chain-link converter may include establishing a switching duration signature of the chain-link converter. The step of identifying the or each sub-module with a switching characteristic that deviates from the switching characteristic signature as being a faulty sub-module may include identifying the or each sub-module with a switching duration that deviates from the switching duration signature.

Use of a switching duration and switching duration signature can enable individual anomalous events to be identified. Also, the method may comprise automatically and/or immediately taking actions in response to identifying a faulty sub-module.

In an embodiment of the invention the switching characteristic signature takes the form of a signature distribution of sub-module switching characteristics.

Having the switching characteristic signature take the form of a signature distribution of sub-module switching characteristics readily isolates a sub-module with a deviant switching characteristic, and so permits its quick and easy identification thereafter.

In an embodiment, the step of identifying the or each sub-module with a switching characteristic that deviates from the switching characteristic signature includes identifying the or each sub-module with a switching characteristic that lies outside the signature distribution of sub-module switching characteristics.

Identifying the or each sub-module with a switching characteristic that lies outside the signature distribution of sub-module switching characteristics can be readily carried out when the measured switching characteristics of the various sub-modules are presented in both tabular and graphical form, and so provides a good deal of flexibility in terms of identifying one or more faulty sub-modules.

The signature distribution of sub-module switching characteristics may be defined by a range of switching characteristic values. For example, the signature distribution of sub-module switching characteristics may be defined by a frequency range or a range of duration values.

Such a step provides a reliable means of discriminating between healthy and abnormal switching characteristics such that one or more faulty sub-modules may be readily identified.

Optionally the signature distribution of sub-module switching characteristics includes only those switching characteristic sub-ranges which together form a main cluster.

Establishing the signature distribution of sub-module switching characteristics in the foregoing manner provides a reliable and repeatable way of determining the signature distribution while at the same time helping to ensure that only sub-modules with deviant switching characteristics lie outside the signature distribution.

In a further embodiment of the invention the step of measuring a switching characteristic of each sub-module includes representing visually the distribution of sub-module switching characteristics of all sub-modules within the chain-link converter.

Such visual representation of the distribution of switching characteristics may take the form of, e.g. a histogram or scatter graph, both of which provide an 'at a glance' indication of the operating performance of each sub-module and, in particular, readily allow the quick and easy identification visually of a faulty sub-module.

In another embodiment of the invention the switching characteristic signature takes the form of an average switching characteristic of all the sub-modules in the chain-link converter.

Having the switching characteristic signature take the form of an average switching characteristic of all the sub-modules in the chain-link converter readily isolates a sub-module with a deviant switching characteristic, and so permits its quick and easy identification thereafter Optionally the step of identifying the or each sub-module with a switching characteristic that deviates from the switching characteristic signature includes identifying the or each sub-module with a switching characteristic that differs from the average switching characteristic of all the sub-modules in the chain-link converter by a threshold amount or more.

Identifying the or each sub-module with a switching characteristic that differs from the average switching characteristic of all the sub-modules in the chain-link converter by a threshold amount or more can be readily carried out computationally with a low processing overhead.

In an embodiment, the threshold amount is established according to operating conditions of the chain-link converter.

Having a threshold amount that varies and is configurable in the aforementioned manner permits less tolerance of potentially faulty sub-modules to be instigated, e.g. in circumstances when operation of the chain-link converter is critical, and/or greater tolerance of potentially faulty sub-modules to be accommodated in other situations.

The method may further include the step of signalling an alarm condition when a faulty sub-module is identified. Such a step desirably indicates, e.g. to a human supervisor, the existence of a faulty sub-module without the need for the supervisor to constantly monitor operation of the chain-link converter.

In a further embodiment of the invention measuring a switching characteristic of each sub-module of the chain-link converter includes establishing for each sub-module an average switching characteristic over a predetermined time period.

Establishing an average switching characteristic, in particular an average switching frequency, over a predetermined time period, e.g. 60 seconds, for each sub-module helps to avoid erroneous identification of a faulty sub-module, e.g. during temporarily abnormal operation of the chain-link converter.

Optionally the method further includes the step of comparing the switching characteristic signature of the chain-link converter with the switching characteristic signature of at least one other chain-link converter within the same voltage source converter.

Such a step can be used readily, e.g. visually, to identify a given chain-link converter, such as may form a converter limb portion, which is likely to contain at least one faulty sub-module In an embodiment, the method further includes the step of comparing the switching characteristic signature of the chain-link converter with a reference switching characteristic signature.

Such a reference switching characteristic signature can be representative of, e.g. the healthy operation of a voltage source converter, such that a rapid assessment of whether a particular voltage source converter is operating healthily, and/or whether associated control system algorithms are performing correctly, is possible simply by comparing the actual switching characteristic signature of the chain-link converter with the reference switching characteristic signature.

The switching characteristic signature may comprise a switching characteristic threshold. The method may comprise comparing the switching characteristic with a switching characteristic threshold, and identifying the or each sub-module for which the switching characteristic exceeds the switching characteristic threshold as being a faulty sub-module. The switching characteristic threshold may comprise a duration threshold.

According to a further aspect of the invention there is provided a controller for a chain-link converter, the chain-link converter including a plurality of sub-modules, the controller configured to: measure a switching frequency characteristic of each sub-module of the chain-link converter; establish a switching characteristic signature of the chain-link converter; and identify the or each sub-module with a switching characteristic that deviates from the switching characteristic signature as being a faulty sub-module.

The controller may perform any of the method steps disclosed herein.

There may be provided a computer program, which when run on a computer, causes the computer to configure any apparatus, including a circuit, controller, converter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

BRIEF DESCRIPTION OF THE DRAWINGS

There now follows a brief description of embodiments of the invention, by way of non-limiting example, with reference to the accompanying figures in which.

DETAILED DESCRIPTION

A method, according to a first embodiment of the invention, of identifying a faulty sub-module 26 of a chain-link converter 24 comprises the steps of: measuring a switching frequency of each sub-module 26 of the chain-link converter 24; establishing a switching frequency signature 40 of the chain-link converter 24, optionally from the measured switching frequencies; and identifying the or each sub-module 26 with a switching frequency that deviates from the switching frequency signature 40 as being a faulty sub-module 42.

The switching frequency is an example of a switching characteristic. The switching frequency signature 40 is an example of a switching characteristic signature.

More particularly, measuring the switching frequency of each sub-module 26 includes establishing for each sub-module 26 an average switching frequency over a 60 second time period, although in other embodiments of the invention the time period may be more than or less than sixty seconds. Averaging over a period of time can enable long term patterns to be identified.

Such measuring can be performed online, i.e. during operation of the chain-link converter 24, e.g. using live data provided by a controller which controls operation of the chain-link converter 24, or it can be carried out offline by analysis of suitable log files.

Figure 1:
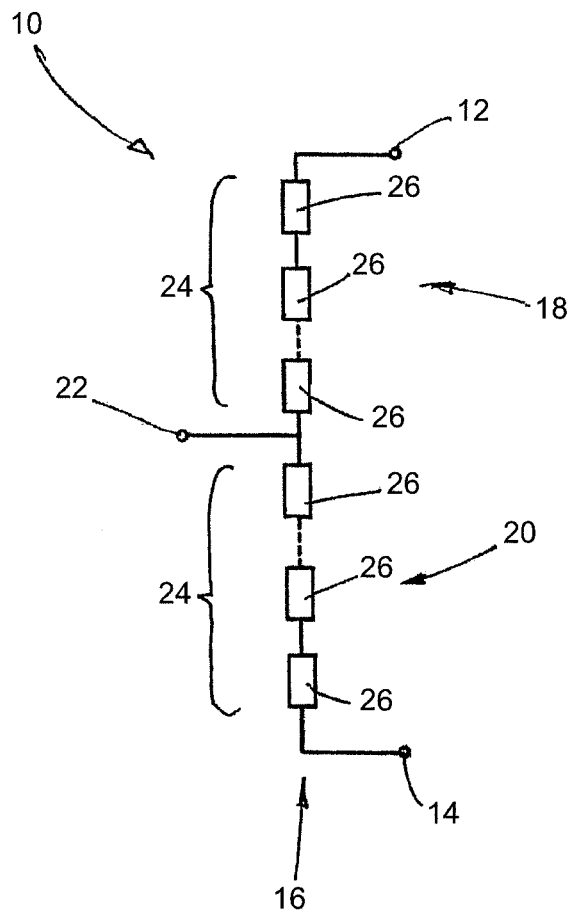
FIG. 1 shows a schematic view of a voltage source converter.
Figure 2:
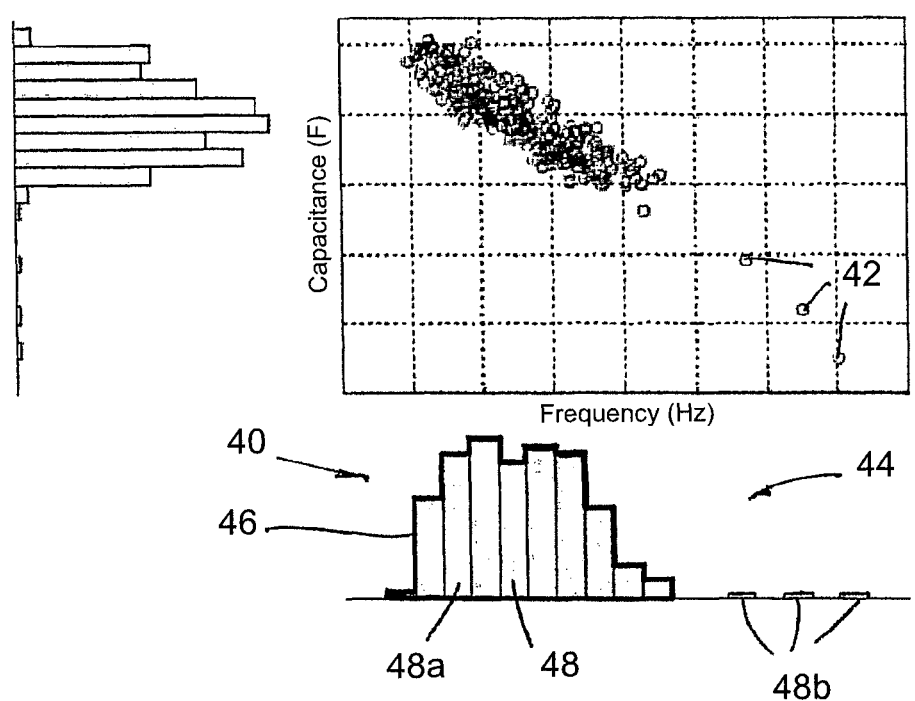
FIG. 2 shows a visual representation of the distribution of sub-module switching frequencies according to a first embodiment of the invention.

In addition, such measuring of the switching frequencies also includes representing visually the distribution of sub-module 26 switching frequencies of all the sub-modules 26 within the chain-link converter 24. In the first embodiment of the invention, such visual representation takes the form of a histogram 44, as shown in FIG. 2. The histogram 44 includes a number of histogram bars 48, each of which illustrates the number of sub-modules 26 with a switching frequency within a particular sub-range of switching frequencies. Other forms of visual representation, i.e. other graphical formats, are also possible.

The switching frequency signature 40 takes the form of a signature distribution 46 of sub-module switching frequencies, as shown in bold outline in FIG. 2. In the embodiment shown the signature distribution 46 includes only certain histogram bars 48a, for example only those which lie immediately adjacent to one another such that together they form a main cluster, i.e. the signature distribution 46 omits other histogram bars 48b which are spaced from the main cluster. In other embodiments of the invention, however, the signature distribution 46 may include a different selection of switching frequency sub-ranges, such as only those switching frequency sub-ranges which identify a plurality of sub-modules. The signature distribution may also be defined by individual switching frequencies (rather than sub-ranges of switching frequencies) and, for example, include only those switching frequencies grouped or clustered around a predetermined switching frequency. The signature distribution may also be defined by a simple frequency range between upper and lower frequency values.

The use of a signature distribution 46 that includes only switching frequency sub-ranges which together form a main cluster, i.e. includes only certain histogram bars 48a, means that in the embodiment shown the three sub-modules with a switching frequency 42 that deviates from the switching frequency signature 40, i.e. the signature distribution 46, clearly lie in other frequency sub-ranges, i.e. in other histogram bars 48b, which fall outside the signature distribution 46 and so can be readily identified visually as being faulty sub-modules.

More particularly, each faulty sub-module 42 has a capacitance that is significantly lower than that of each of the other sub-modules 26, such that they each have a switching rate, i.e. a switching frequency, which is higher than the range of switching frequencies covered by the signature distribution 46, such that it lies outside the signature distribution 46.

The switching frequency signature 40, i.e. the signature distribution 46, may be compared with the switching frequency signature, i.e. a corresponding signature distribution (not shown), of at least one other chain-link converter 24 within the same voltage source converter 10 in order to readily and quickly visually identify one chain-link converter 24 which potentially includes a faulty sub-module.

Similarly, the switching frequency signature 40, i.e. the signature distribution 46, may be compared with a reference switching frequency signature, i.e. a corresponding reference signature distribution (not shown), which is, e.g. representative of the healthy operation of the voltage source converter 10 under the same operating conditions (i.e. when delivering the same active or reactive power under the same control mode), in order to permit a rapid assessment of whether the voltage source converter 10 is operating healthily, and/or whether associated control system algorithms are performing correctly.

A method of identifying a faulty sub-module 26 of a chain-link converter 24, according to a second embodiment of the invention, is similar to the first embodiment of the invention and likewise includes the steps of: measuring a switching frequency of each sub-module 26 of the chain-link converter 24; establishing a switching frequency signature of the chain-link converter 24, optionally from the measured switching frequencies; and identifying the or each sub-module 26 with a switching frequency that deviates from the switching frequency signature as being a faulty sub-module.

Measuring the switching frequency of each sub-module 26 may again include establishing for each sub-module 26 an average switching frequency over a 60 second time period, although the time period may differ from this.

Such measuring can similarly be performed online, i.e. during operation of the chain-link converter 24, e.g. using live data provided by a controller which controls operation of the chain-link converter 24, or it can be carried out offline by analysis of suitable log files.

However, the step of establishing a switching frequency signature of the chain-link converter 24 from the measured switching frequencies does differ from that of the first embodiment of the invention.

In particular, in the second embodiment of the invention, the switching frequency signature instead takes the form of an average switching frequency of all the sub-modules 26 in the chain-link converter 24.

In a similar manner the step of identifying the or each sub-module 26 with a switching frequency that deviates from the switching frequency signature also differs from the first embodiment of the invention in that in the second method of the invention it includes identifying the or each sub-module 26 with a switching frequency that differs from the average switching frequency of all the sub-modules 26 in the chain-link converter 24 by a threshold amount or more.

The threshold amount is established according to operating conditions of the chain-link converter 24, although this need not necessarily be the case.

In this way a faulty sub-module which has a capacitance that is significantly lower than that of each of the other sub-modules 26 will again have a switching frequency which is higher than the range of switching frequencies covered by the average switching frequency and associated threshold amount offset. As a result the switching frequency of the faulty sub-module will differ from the average switching frequency of all the sub-modules 26 in the chain-link converter 24 by an amount equal to or greater than the threshold amount, so that it is readily identifiable as a faulty sub-module.

The switching frequency signature, i.e. the average switching frequency of all the sub-modules 26 in the chain-link converter 24, may again be compared with the switching frequency signature, i.e. a corresponding average switching frequency of all the sub-modules 26, of at least one other chain-link converter 24 within the same voltage source converter 10 in order to readily and quickly visually identify one chain-link converter 24 which potentially includes a faulty sub-module.

Similarly, the switching frequency signature 40, i.e. the average switching frequency of all the sub-modules 26 in the chain-link converter 24, may likewise be compared with a reference switching frequency signature, i.e. a corresponding reference average switching frequency, which is, e.g. representative of the healthy operation of the voltage source converter 10 under the same operating conditions (i.e. when delivering the same active or reactive power under the same control mode), in order to permit a rapid assessment of whether the voltage source converter 10 is operating healthily, and/or whether associated control system algorithms are performing correctly.

In further embodiments of the invention, the switching characteristic may comprise a switching duration instead of the switching frequency that is discussed above. Similarly, the switching characteristic signature may comprise a switching duration signature. Each of the examples discussed above in relation to processing a switching frequency in relation to a switching frequency signature, can be used to additionally or alternatively process a switching duration in relation to a switching duration signature in the same or a similar way.

The switching duration may be considered a sub-module-state-time that represents how long the sub-module has been in a current state. The sub-module-state-time can include a sub-module-off-time that relates to a length of time that the sub-module is off and/or a sub-module-on-time that relates to a length of time that the sub-module is on. The sub-module-state-time can be monitored and compared with a maximum-state-time-threshold. The sub-module-off-time can be monitored and compared with a maximum-off-time-threshold. The sub-module-on-time can be monitored and compared with a maximum-on-time-threshold. Each of these thresholds is an example of a switching characteristic threshold. If a threshold is reached or exceeded, then the sub-module can be identified as a faulty sub-module. That is, if a threshold is reached or exceeded then it can be said to deviate from a switching duration threshold. The threshold need not necessarily be based on measured switching characteristics.

Use of a switching duration can enable individual anomalous events to be readily identified. If a sub-module is identified as a faulty sub-module it can be considered as "locked" in a particular state. The sub-module can be identified/flagged such that some action can be automatically taken. The action can also be taken immediately because in some examples there is no need to wait a period of time while an averaging operation is performed.

Figure 3:
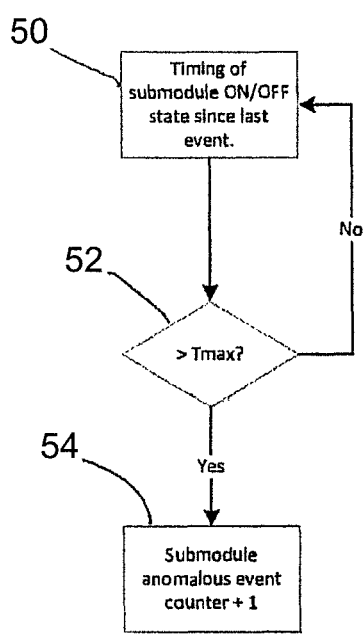
FIG. 3 shows an example algorithm that counts a number of anomalous events for a sub-module.

FIG. 3 shows an example algorithm flowchart diagram that counts the number of anomalous events for each sub-module, based on a switching duration characteristic. Incrementing a counter is an example of action that can be taken in response to identifying a faulty sub-module.

At step 50, the algorithm comprises measuring the timing of a sub-module's ON/OFF state since the last switching event for that sub-module. This measured timing value is an example of a switching characteristic.

At step 52, the measured timing value is compared with a maximum-threshold value (Tmax). If the measured timing value is less than or equal to Tmax, then the algorithm returns to step 50. If the measured timing value is greater than Tmax, then the algorithm moves on to step 54 and increments a counter associated with the sub-module. In this example, the counter is referred to as a sub-module-anomalous-event-counter. Optionally, the algorithm may also include recording or reporting the value of the counter associated with each sub-module.

Figure 4:
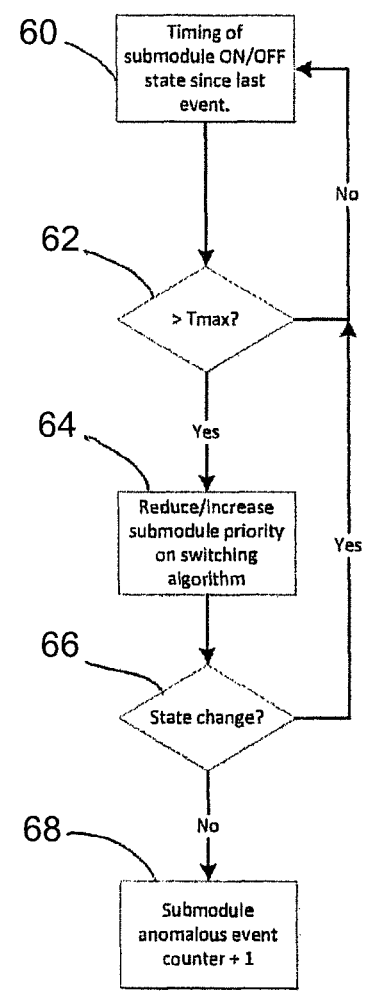
FIG. 4 shows an example algorithm that modifies a switching algorithm based on an identification of an anomalous event.

FIG. 4 shows another example algorithm flowchart diagram that modifies a switching algorithm, based on an identification of an anomalous event. Modifying a switching algorithm is an example of action that can be taken in response to identifying a faulty sub-module.

A switching algorithm can be used to define when control signals are provided to the at least one switching element (not shown) in each chain-link sub-module 26 in order for the chain-link converter to provide the desired voltage waveform. The switching algorithm may also be referred to as a control system algorithm.

At step 60, the flowchart comprises measuring the timing of a sub-module's ON/OFF state since the last switching event for that sub-module. At step 62, the measured timing value is compared with a maximum-state-time-threshold value (Tmax). If the measured timing value is less than or equal to Tmax, then the flowchart returns to step 60. If the measured timing value is greater than Tmax, then the flowchart moves on to step 64 and increments a counter associated with the sub-module.

At step 64, the flowchart modifies the switching algorithm. Such modification can include increasing or decreasing a priority associated with the sub-module, which is taken into account by the switching algorithm when forcing a change in the state of the sub-module. For example, at times where the switching algorithm has a choice of which one or more of the total number of sub-modules to operate in order to change the state of the sub-module, the switching algorithm can operate a sub-module that has a high priority. By decreasing the priority of sub-modules that are identified as faulty, the impact of the faulty sub-module on the chain-link converter can be reduced.

At step 66, the flowchart determines whether or not there has been a change in the state of the sub-module following the modification of the switching algorithm at step 64. If there is a state change, then the flowchart returns to step 60. If there has not been a state change, the then flowchart moves on to step 68 and increments a counter associated with the sub-module.

This written description uses examples to disclose the invention, including the embodiments, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of identifying a faulty sub-module of a chain-link converter, the chain-link converter including a plurality of sub-modules, each sub-module including at least one switching element and an energy storage device which together are selectively operable to provide a voltage source, the method comprising the steps of:
    measuring a switching characteristic of each sub-module of the chain-link converter;
    establishing a switching characteristic signature of the chain-link converter; and
    identifying the or each sub-module with a switching characteristic that deviates from the switching characteristic signature as being a faulty sub-module;
    wherein the step of measuring a switching characteristic of each sub-module of the chain-link converter includes measuring a switching frequency of each sub-module of the chain-link converter;
    the step of establishing a switching characteristic signature of the chain-link converter includes establishing a switching frequency signature of the chain-link converter from the measured switching frequencies; and
    the step of identifying the or each sub-module with a switching characteristic that deviates from the switching characteristic signature as being a faulty sub-module includes identifying the or each sub-module with a switching frequency that deviates from the switching frequency signature.

2. The method according to claim 1 wherein:
    the step of measuring a switching characteristic of each sub-module of the chain-link converter includes measuring for each sub-module of the chain-link converter a switching duration between the sub-module providing a voltage source and not providing a voltage source;
    the step of establishing a switching characteristic signature of the chain-link converter includes establishing a switching duration signature of the chain-link converter; and
    the step of identifying the or each sub-module with a switching characteristic that deviates from the switching characteristic signature as being a faulty sub-module includes identifying the or each sub-module with a switching duration that deviates from the switching duration signature.

3. The method according claim 1 wherein the switching characteristic signature takes the form of a signature distribution of sub-module switching characteristics.

4. The method according to claim 3 wherein the step of identifying the or each sub-module with a switching characteristic that deviates from the switching characteristic signature includes identifying the or each sub-module with a switching characteristic that lies outside the signature distribution of sub-module switching characteristics.

5. The method according to claim 3 wherein the signature distribution of sub-module switching characteristics is defined by a range of switching characteristic values.

6. The method according to claim 3 wherein the signature distribution of sub-module switching characteristics includes only those switching characteristic sub-ranges which together form a main cluster.

7. The method according to claim 1 wherein the step of measuring a switching characteristic of each sub-module includes representing visually the distribution of sub-module switching characteristics of all sub-modules within the chain-link converter.

8. The method according to claim 1 wherein the switching characteristic signature takes the form of an average switching characteristic of all the sub-modules in the chain-link converter.

9. The method according to claim 8 wherein the step of identifying the or each sub-module with a switching characteristic that deviates from the switching characteristic signature includes identifying the or each sub-module with a switching characteristic that differs from the average switching characteristic of all the sub-modules in the chain-link converter by a threshold amount or more.

10. The method according to claim 9 wherein the threshold amount is established according to operating conditions of the chain-link converter.

11. The method according to claim 1 further including the step of signalling an alarm condition when a faulty sub-module is identified.

12. The method according to claim 1 wherein measuring a switching characteristic of each sub-module of the chain-link converter includes establishing for each sub-module an average switching characteristic over a predetermined time period.

13. The method according to claim 1 further including the step of comparing the switching characteristic signature of the chain-link converter with the switching characteristic signature of at least one other chain-link converter within the same voltage source converter.

14. The method according to claim 1 further including the step of comparing the switching characteristic signature of the chain-link converter with a reference switching characteristic signature.

15. The method according to claim 1 wherein the switching characteristic signature comprises a switching characteristic threshold, and the method further comprises:
    comparing the switching characteristic with a switching characteristic threshold, and identifying the or each sub-module for which the switching characteristic exceeds the switching characteristic threshold as being a faulty sub-module.

16. A controller for a chain-link converter, the chain-link converter including a plurality of sub-modules, the controller configured to:
    measure a switching frequency characteristic of each sub-module of the chain-link converter;
    establish a switching characteristic signature of the chain-link converter; and
    identify the or each sub-module with a switching characteristic that deviates from the switching characteristic signature as being a faulty sub-module;
    wherein measuring a switching characteristic of each sub-module of the chain-link converter includes measuring a switching frequency of each sub-module of the chain-link converter;
    establishing a switching characteristic signature of the chain-link converter includes establishing a switching frequency signature of the chain-link converter from the measured switching frequencies; and
    identifying the or each sub-module with a switching characteristic that deviates from the switching characteristic signature as being a faulty sub-module includes identifying the or each sub-module with a switching frequency that deviates from the switching frequency signature.

17. A non-transitory computer readable medium comprising a computer program that when executed by a processor, causes the processor to perform the method of claim 1.

* * * * *